United States Patent [19]
Ibok

[11] Patent Number: 6,043,138
[45] Date of Patent: Mar. 28, 2000

[54] MULTI-STEP POLYSILICON DEPOSITION PROCESS FOR BORON PENETRATION INHIBITION

[75] Inventor: Effiong E. Ibok, Sunnyvale, Calif.

[73] Assignee: Advanced Micro Devices, Inc., Sunnyvale, Calif.

[21] Appl. No.: 08/959,105

[22] Filed: Oct. 23, 1997

Related U.S. Application Data

[63] Continuation of application No. 08/715,266, Sep. 16, 1996, abandoned.

[51] Int. Cl.[7] .......................... H01L 21/265; H01L 29/78
[52] U.S. Cl. ............................. 438/493; 257/411
[58] Field of Search ................... 437/40 GS, 41 GS, 437/46, 239, 242, 954; 148/DIG. 35, DIG. 112; 257/288, 364, 411, 407; 438/287, 491, 493, 591, 592, 763, 769, 775

[56] References Cited

U.S. PATENT DOCUMENTS 4,755,865   7/1988   Wilson et al. .
5,364,803  11/1994   Lur et all. ........................ 437/40 GS
5,567,638  10/1996   Lin et al. ................................ 437/46

FOREIGN PATENT DOCUMENTS 4333160   3/1995   Germany .

OTHER PUBLICATIONS

Y. H. Lin et al., IEEE Electron Dev. Lett. 16(6)(1995)248, "Nitridation of . . . gate to suppress the boron penetration in PMOS" Jun.

Y. H. Lin et al. Jpn. J. Appl. Phys. 34(2b)(1995)752 "Supression of boron penetration in PMOS by using oxide . . . in gate" Feb.

Y. H. Lin et al. IEEE Trans. Electron Dev. 43(7)(1996)1161 Nitridization of the stacked poly–si gate to suppress the boron . . . Jul.

H. Fukuda et al., Jpn. J. Appl. Phys. 29(12)(1990) L2333 ". . . Nitirided SiO2 films . . . by RTP in an N2O ambient" Dec.

*Primary Examiner*—Charles Bowers
*Assistant Examiner*—Keith Christianson
*Attorney, Agent, or Firm*—Sawyer Law Group

[57] ABSTRACT

The present invention provides an improved semiconductor device and method of impeding the diffusion of boron by providing at least one layer of polysilicon and an interface substance. A semiconductor device according to the present invention is comprised of a substrate; gate oxide coupled to the substrate; a layer of polysilicon coupled to the gate oxide; and an interface layer between the layer of polysilicon and the gate oxide, wherein the interface layer impedes diffusion of doping material.

23 Claims, 6 Drawing Sheets

MULTI-STEP POLYSILICON DEPOSITION PROCESS FOR BORON PENETRATION INHIBITION

This application is a continuation of application Ser. No. 08/715,266, filed Sep. 16, 1996, now abandoned.

FIELD OF THE INVENTION

The present invention relates to an improved semiconductor device and an improved method for manufacturing semiconductor devices. More particularly, the present invention is a semiconductor device which inhibits boron diffusion and a method of manufacturing semiconductors which inhibit boron diffusion.

BACKGROUND OF THE INVENTION

In the semiconductor industry, the basic steps of the conventional method of manufacturing P-doped gate structures have been fairly standardized. The process begins with the silicon substrate upon which a layer of barrier oxidation is positioned. After various steps, areas of field oxide become situated between blocks of barrier nitride. Gate oxide is then typically grown between the areas of field oxide. A layer of polysilicon is typically positioned over the areas of field oxide and the gate oxide. Then, through various steps, a block of polysilicon is situated above the gate oxide. Finally, boron diflouride ($BF_2$) is implanted in the polysilicon. Subsequent to the $BF_2$ implantation, rapid thermal anneal (RTA) is typically initiated wherein the wafers are heated and the implants are activated and driven.

During the implantation step, boron has a strong tendency to diffuse through the oxide and into the substrate. This diffusion of boron causes the reliability of the semiconductor device to be compromised. In the current conventional processing methods, there is nothing to impede the progress of boron diffusion. Thus, there is a need for an improved semiconductor device and an improved processing method which impedes the diffusion of boron through the gate oxide. The present invention addresses such a need.

SUMMARY OF THE INVENTION

The present invention provides an improved semiconductor device and method of impeding the diffusion of boron by providing at least one layer of polysilicon and an interface substance.

A semiconductor device according to the present invention is comprised of a substrate; gate oxide coupled to the substrate; a layer of polysilicon coupled to the gate oxide; and an interface layer between the layer of polysilicon and the gate oxide, wherein the interface layer impedes diffusion of doping material.

Another aspect of the invention is a method of manufacturing semiconductors comprising the steps of providing a substrate; providing a gate oxide coupled to the substrate; providing a first layer of polysilicon over the gate oxide; providing an interface layer over the first layer of polysilicon; and providing a second layer of polysilicon over the oxide layer.

DETAILED DESCRIPTION OF THE INVENTION

Figure 1A:
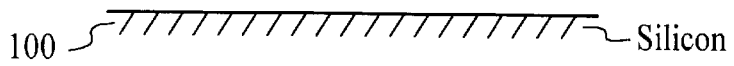
FIGS. 1A–1K illustrate the basic conventional steps of manufacturing a semiconductor device.
Figure 1B:
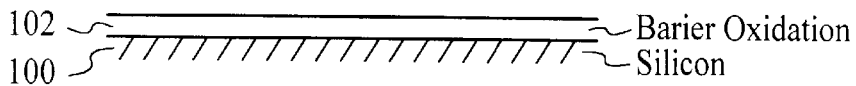
Figure 1C:
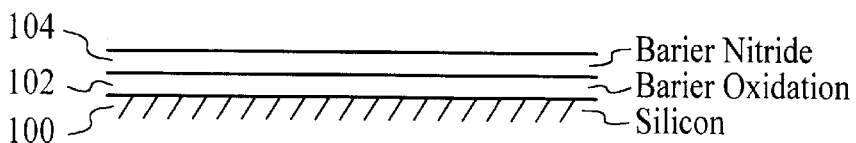
Figure 1D:
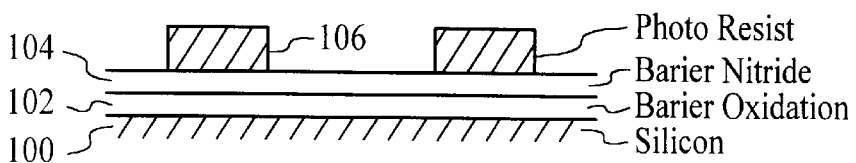
Figure 1E:
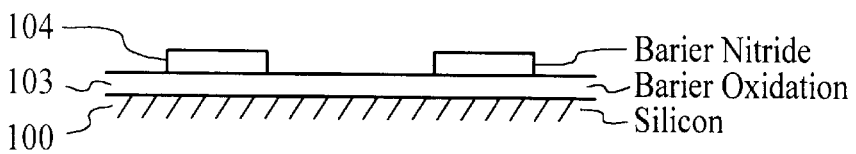

FIG. 1 illustrates the basic conventional steps of manufacturing P-doped gate structures. The process begins with the silicon substrate 100 as shown in FIG. 1A. A barrier oxidation layer 102 is provided above the silicon 100 in FIG. 1B. A barrier nitride layer 104 is then provided over the barrier oxide layer 102 in FIG. 1C. Photoresist 106 is then positioned over the barrier nitride 104 in FIG. 1D during the source/drain mask step of FIG. 1D. In FIG. 1E, the source/drain etch step leaves blocks of barrier nitride 104 over the barrier oxide layer 102.

Figure 1F:
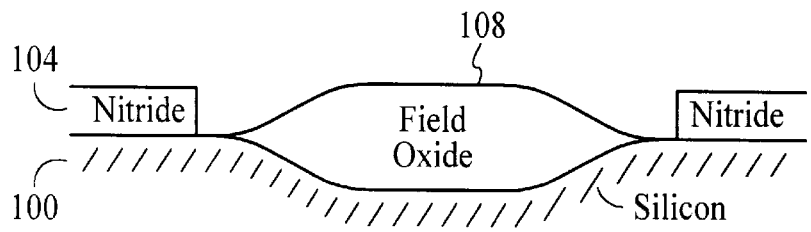
Figure 1G:
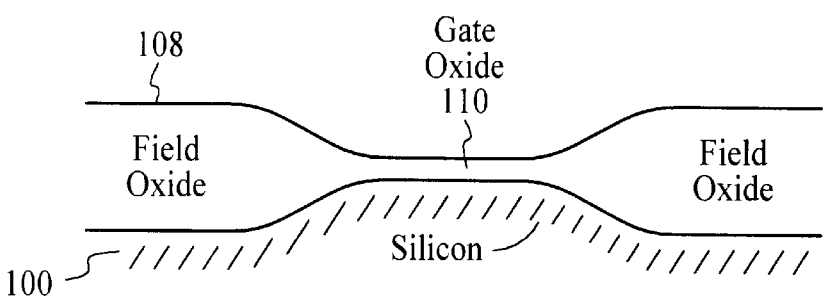

In FIG. 1F, the field oxidation step leaves the field oxide 108 between the barrier nitride blocks 104. The gate oxide 110 is then typically grown between the field oxide 108 as shown in FIG. 1G.

Figure 1H:
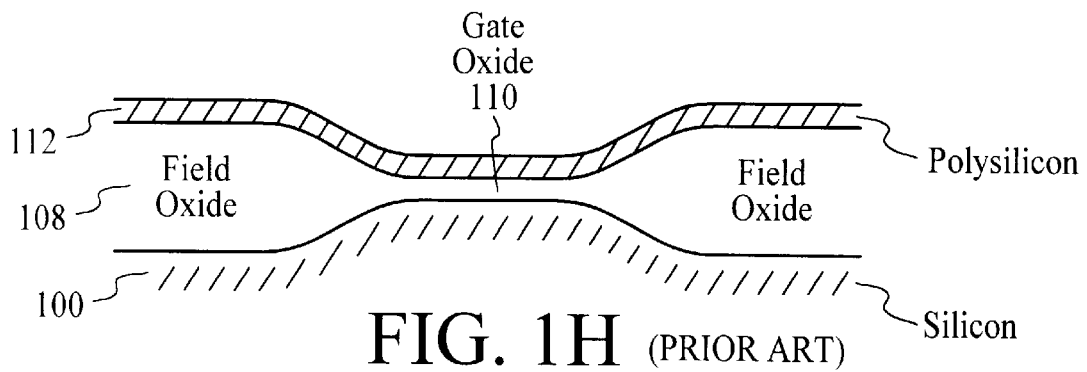
Figure 1I:
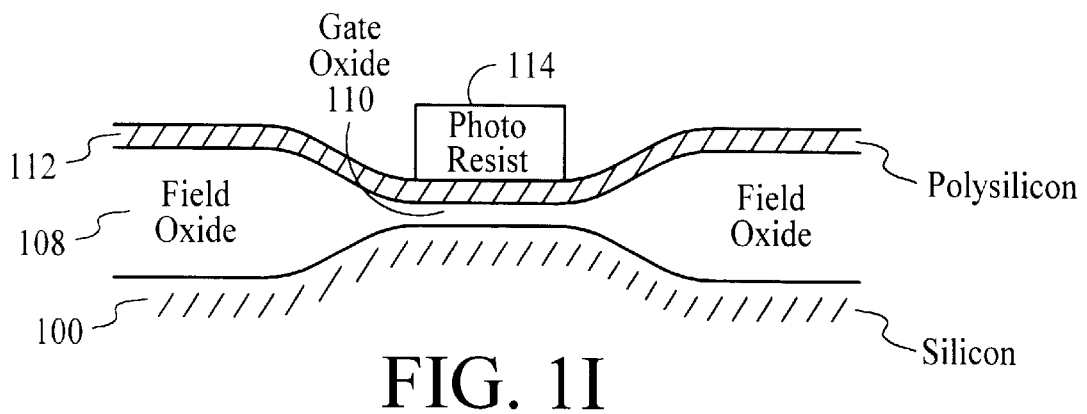
Figure 1J:
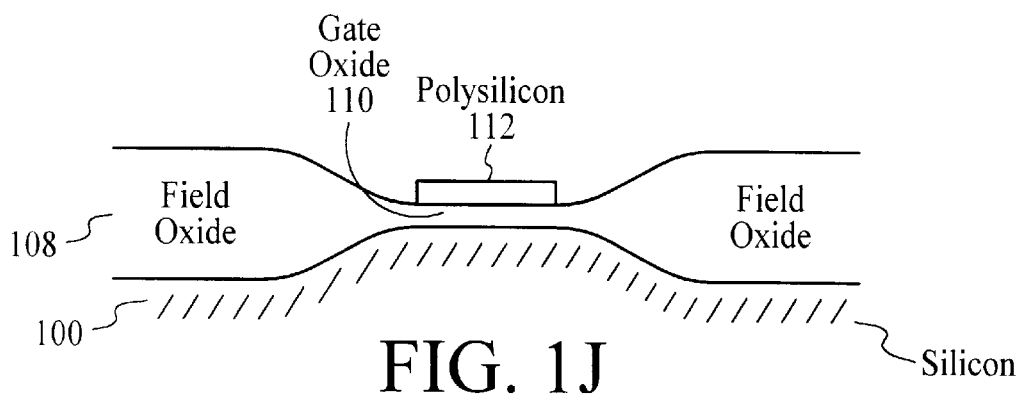

Thereafter, a layer of polysilicon 112 is typically positioned over the field oxide 108 and the gate oxide 110 as shown in FIG. 1H. Next, the photoresist 114 is placed above the polysilicon layer 112, as shown in FIG. 1I. The polygate etch step shown in FIG. 1J leaves a block of polysilicon 112 above the gate oxide 110.

Figure 1K:
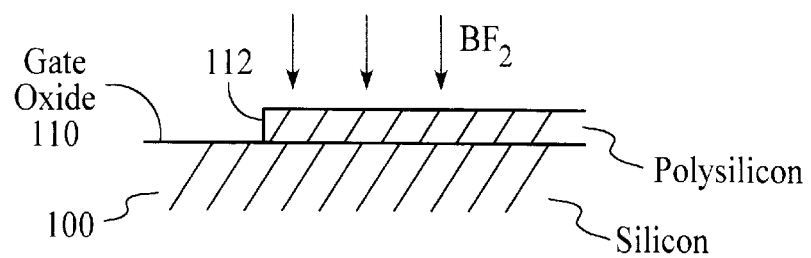

The P-doped gate structures are typically doped with boron difluoride ($BF_2$). The $BF_2$ implantation is shown in FIG. 1K where $BF_2$ is implanted in the polysilicon 112. Subsequent to $BF_2$ implantation step, rapid thermal anneal (RTA) is typically initiated wherein the wafers are heated and the implants are activated and driven.

A problem with the current process of manufacture is caused by the implantation of boron. Boron can diffuse through the gate oxide 112 and the silicon substrate 100, thereby compromising the reliability of the device. The diffusion of boron is typically a function of oxide thickness and temperature. Generally, if the oxide thickness is 60 angstroms or below, then boron diffuses readily.

Figure 2:
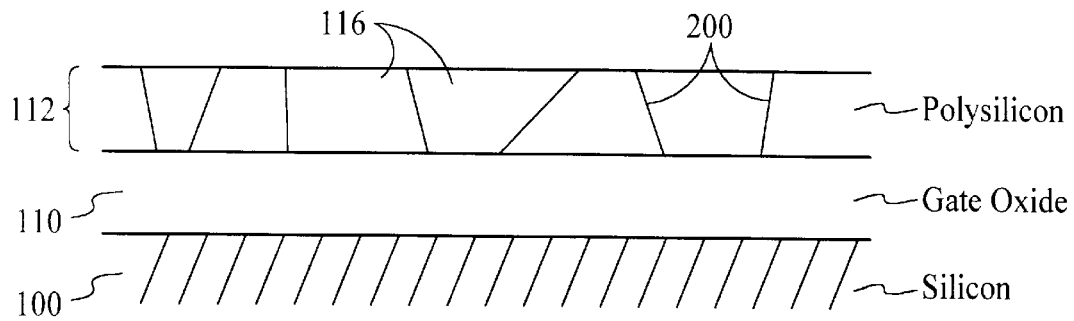
FIG. 2 is a cross section of the layers during the poly-deposition step of the conventional process.

FIG. 2 is a cross section of the layers during the poly-deposition step of FIG. 1H. A detailed view of the polysilicon layer 112 shows that the polysilicon layer is composed of grains 116 with boundaries 200. During the boron implantation step shown in FIG. 1K, the implanted boron tends to channel, i.e. flow through the easiest route for its path. Boron is more likely to channel along the boundaries 200, thus resulting in a diffusion much higher than the bulk of the grain 116. Consequently, there is a high concentration of boron at the grain boundaries 200. The higher the concentration of boron, the faster the boron diffuses towards the oxide 110. In the current conventional processing methods, there is nothing to impede the progress of boron diffusion. Thus, there is a need for a processing method which impedes the diffusion of boron through the gate oxide 110.

Figure 3A:
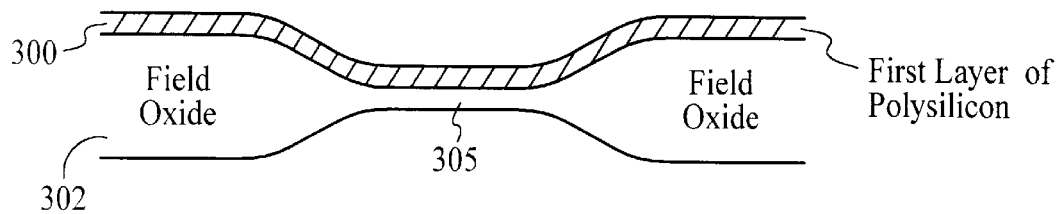
FIGS. 3A–3C illustrate a method and device according to the present invention.
Figure 3B:
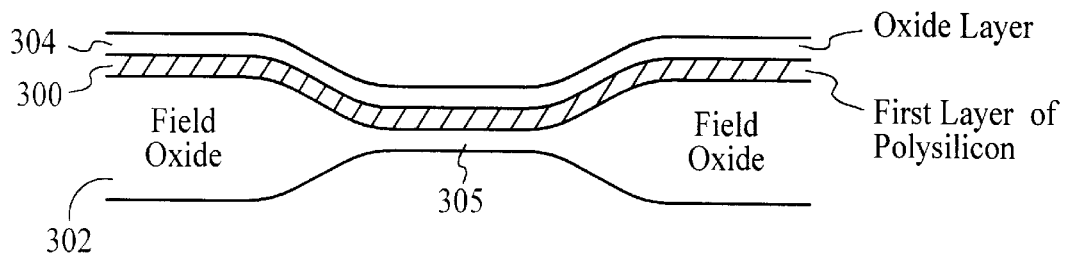
Figure 3C:
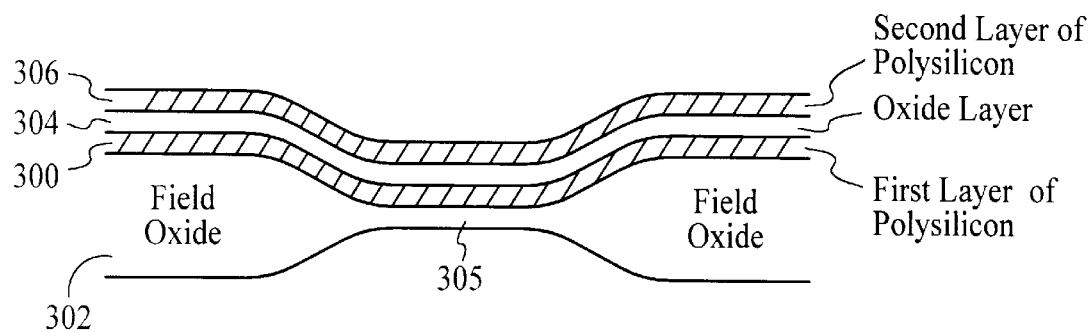

The present invention provides a method of impeding the diffusion of boron by dividing the single poly-deposition step of the conventional process shown in FIG. 1H into a plurality of steps resulting in a plurality of layers of polysilicon and an interface substance. FIGS. 3A–3C show a preferred embodiment of the method for poly-deposition.

First, a first layer of polysilicon 300 is positioned over the gate oxide 306 and field oxide 302 as shown in FIG. 3A. This first layer of polysilicon 300 is preferably less than three hundred angstroms, but the thickness can be in the range of 50 to 500 angstroms. The first layer of polysilicon can be either crystalline or amorphous, although it is preferably amorphous. Next, the first layer of polysilicon is exposed to an oxidation ambient which forms an oxide layer 304 over the first layer of polysilicon as shown in FIG. 3B. The oxide layer 304 is preferably extremely thin, preferably much less than 20 angstroms. Next, a second layer of polysilicon 306 is deposited over the oxide layer 304 as shown in FIG. 3C.

Figure 4A:
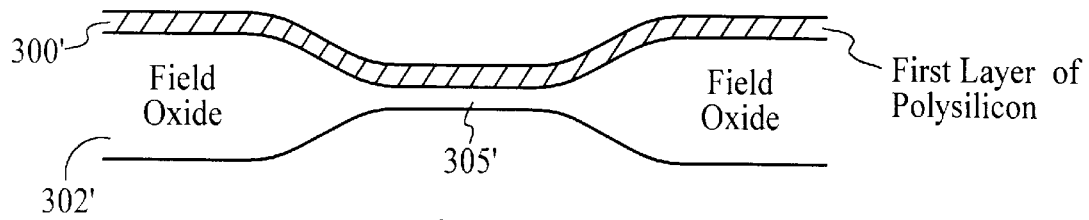
FIGS. 4A–4C illustrate another method and device according to the present invention.
Figure 4B:
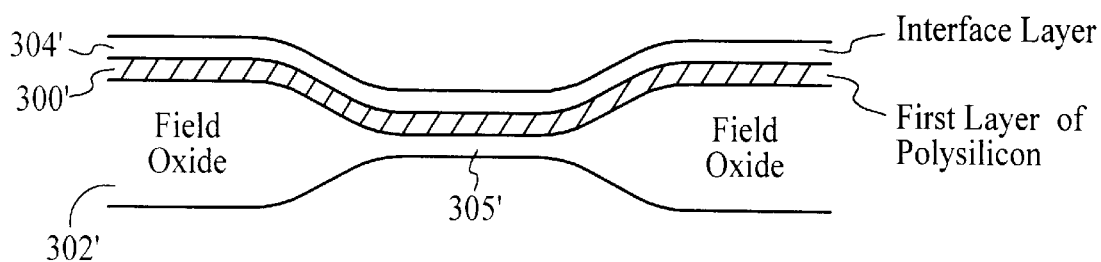
Figure 4C:
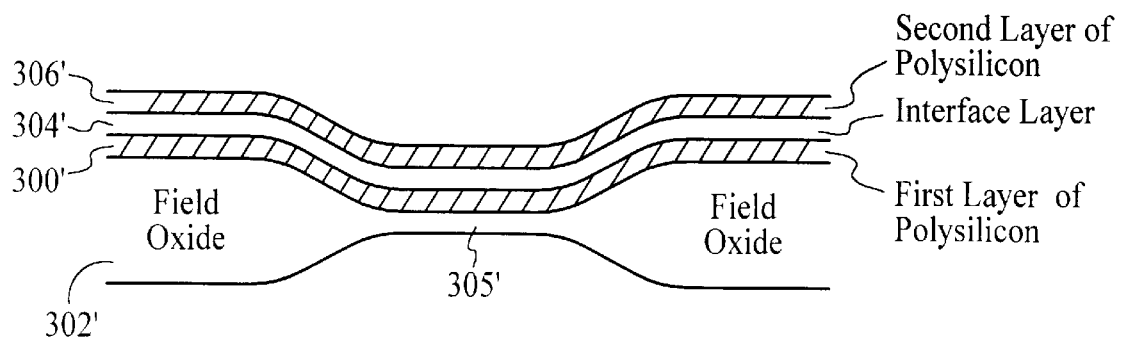

Another embodiment of the present invention is shown in FIGS. 4A–4C. A first layer of polysilicon 300' is positioned over the field oxide 302' as shown in FIG. 4A. The first layer of polysilicon 300' is preferably approximately three hundred angstroms. Next, an interface layer 304' is positioned over the first layer of polysilicon 300' as shown in FIG. 4B.

The interface layer may be formed by flowing gases such as $N_2O$, $NH_3$ or a combination of $N_2O$ and $NH_3$ over the first layer. This interface layer 304' would form an equivalent thin oxide layer with traces of nitrogen.

Finally, a second layer of polysilicon 306' is positioned over the interface layer 304' shown in FIG. 4C. The thickness of the second layer of polysilicon is preferably approximately 1,700 angstroms.

Figure 5A:
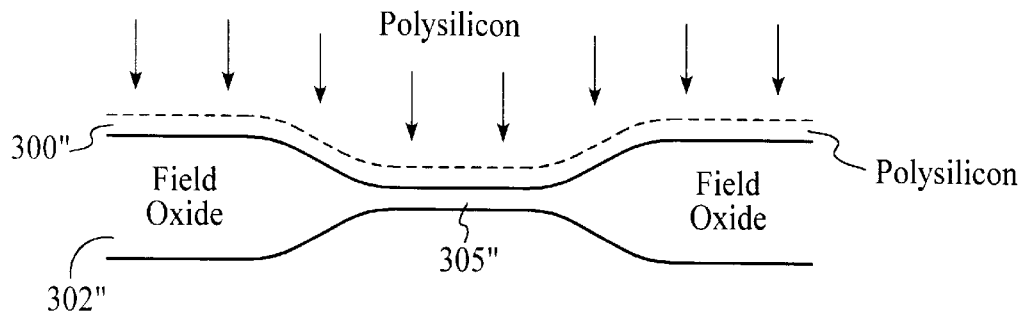
FIGS. 5A–5C illustrate yet another method and device according to the present invention.
Figure 5B:
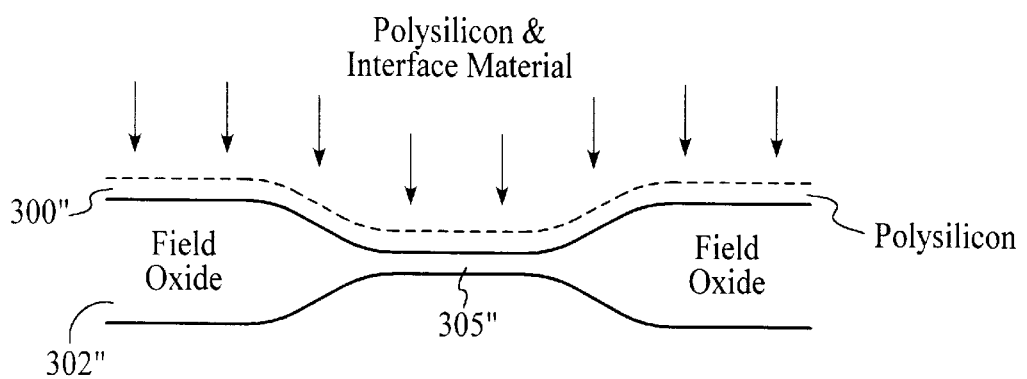
Figure 5C:
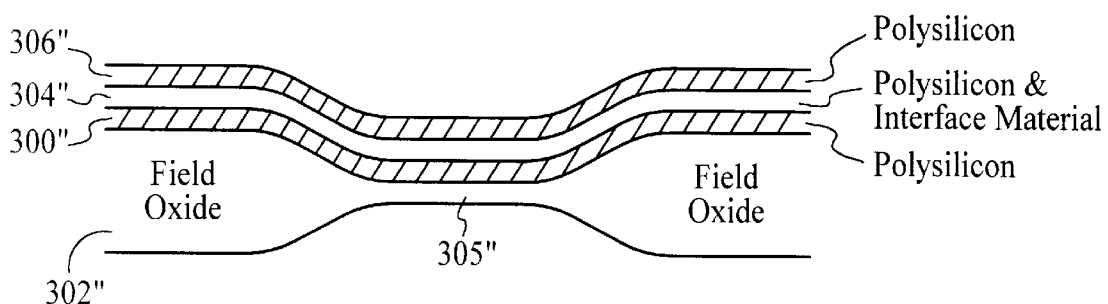

Another embodiment of the present invention is shown in FIGS. 5A-5C. First, a layer of polysilicon 300" is deposited over the field oxide 302" as shown in FIG. 5A. An interface material is introduced into the reaction stream of a polysilicon deposition process over the initial layer of polysilicon 300" as shown in FIG. 5B. Finally, a second layer of polysilicon 306" is deposited over the layer of polysilicon and interface material 304" as shown in FIG. 5C.

Figure 6A:
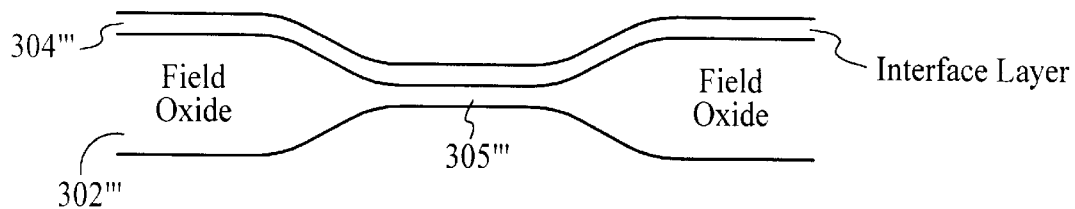
FIGS. 6A–6B illustrate yet another method and device according to the present invention.
Figure 6B:
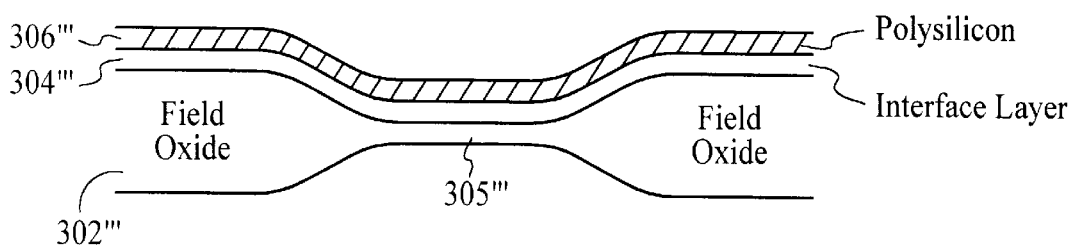

FIGS. 6A–6B shows another embodiment of the present invention. In this embodiment, a very thin film of polysilicon, a preferred thickness of approximately 20 angstroms, can be deposited over the field oxide 302'''. Next, an interface layer 304''' is positioned over the field oxide 302''' as shown in FIG. 6A. The interface layer 304''' is preferably a distinct layer of oxygen or nitrogen-rich silicon. Alternatively, it is preferably a silicon rich silicon oxide or silicon nitride. The thin film of polysilicon is not shown in FIGS. 6a–6b since it is typically so thin that it is not illustrated as an additional layer. A polysilicon layer 306''' is then placed over the interface layer 304''' as shown in FIG. 6B. This polysilicon layer 306''' is preferably approximately 2,000 angstroms thick.

Figure 7:
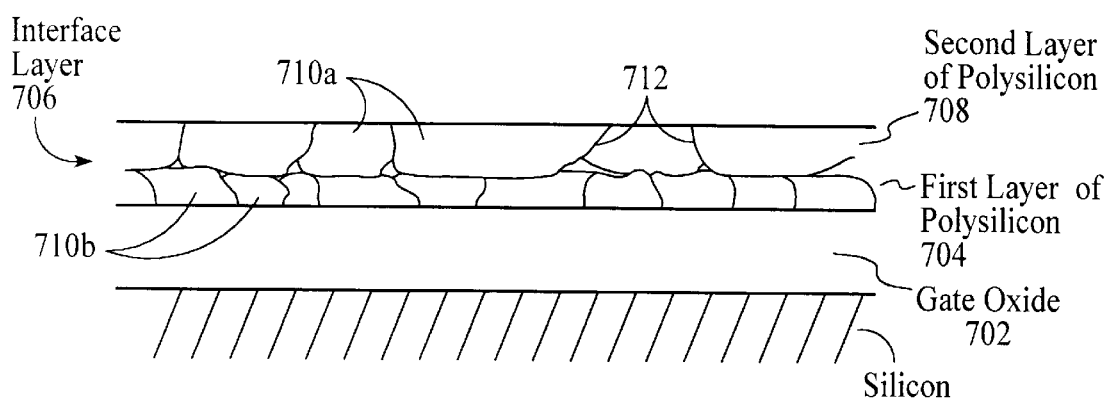
FIG. 7 is a cross section of the layers during the poly-deposition step according to the present invention.

FIG. 7 illustrates a cross sectional view of the various layers on top of the silicon substrate 700. In the method according to the present invention, boron diffusion introduced by the boron difluoride implantation shown in FIG. 1K is minimized. With the multi-step poly-deposition process, there is no continuity of grains 710. The first layer of polysilicon 704 and the second layer of polysilicon 708 prevents the grain boundaries 712 from extending from the top of the polysilicon layer to the bottom at the gate oxide 702. When there is a discontinuity of grains, the boron must travel a longer distance from the top of the polysilicon layer 708, which is the point of implantation, to the gate oxide 702. The effect of the longer distance is equivalent to having a thicker layer of polysilicon above the gate oxide 702.

Additionally, since the boron is implanted from above the second layer of polysilicon 708, there is a much higher concentration of boron in the second layer of polysilicon 708 than in the first layer of polysilicon 704. Since the second layer 708 is doped, the grains 710A of the second layer 708 are larger than the grains 710B of the first layer 704. Thus, there is a larger grain boundary area in the first layer 704 than it would have had, had the poly-deposition step been executed as in the conventional systems. Consequently, the diffusivity of the first layer 704 is much smaller than the diffusivity of the second layer 708. This factor also functions to impede the diffusivity of boron toward the gate oxide 702.

Another factor impeding the diffusivity towards the gate oxide 702 is caused by the interface layer 706. The implantation step shown in FIG. 1k typically uses boron difluoride. Boron tends to move with the fluorine. Fluorine has an affinity for oxygen. The fluorine will be attracted to the oxygen but will typically not go past the oxygen in the interface layer 706. The boron which diffuses into the first layer of polysilicon 704 must travel without the fluorine. Consequently, the interface layer 706 ensures a lower diffusivity of boron into the first layer 704.

For the embodiments producing nitrogen within the interface layer 706, these embodiments impede the boron diffusion since nitrogen impedes boron.

Finally, in the embodiment shown in FIG. 6a–6b, the interface layer 706 is a silicon rich oxide which is very close to the gate oxide 702. The boron collects at the interface layer 706 and typically will not pass into the gate oxide 702.

The device manufactured according to the method of the present invention can typically withstand a wider temperature range than the devices manufactured through the conventional methods. A device manufactured through the conventional methods can typically can withstand a temperature of up to 1025 degrees celsius while the device manufactured according to the method of the present invention can typically withstand a temperature range of approximately up to 1075 degrees celsius. Since a conventional manufacturing system typically does not have accurate temperature control, the present invention improves the reliability of the manufacturing process.

Although the present invention has been described in accordance with the embodiments shown, one of ordinary skill in the art will readily recognize that there could be variations to the embodiments and that those variations would be within the spirit and scope of the present invention. Accordingly, many modifications may be made by one of ordinary skill in the art without departing from the spirit and scope of the appended claims.

I claim:

1. A semiconductor device comprising:
   a substrate;
   a first layer of polysilicon over the substrate, wherein the first layer has a thickness of approximately 20 to 500 angstroms;
   an interface layer over the first layer of polysilicon, wherein the interface layer impedes diffusion of doping material, wherein the interface layer is formed by exposing the first layer of polysilicon to an oxidation ambient; and
   a second layer of polysilicon over the interface layer, wherein the second layer of polysilicon is deposited separately in time from the first layer of polysilicon.

2. The semiconductor device of claim 1 wherein the first layer of polysilicon has a thickness of approximately 50 to 500 angstroms.

3. The semiconductor device of claim 1, wherein the first layer of polysilicon has a thickness which is not greater than 300 angstroms.

4. The semiconductor device of claim 1, wherein the first layer of polysilicon has a thickness of approximately 20 angstroms.

5. The semiconductor device of claim 4, wherein the second layer of polysilicon has a thickness of approximately 2,000 angstroms.

6. The semiconductor device of claim 1, wherein the interface layer includes oxygen and nitrogen.

7. The semiconductor device of claim 1 wherein the interface layer includes nitrogen.

8. The semiconductor device of claim 1, wherein the interface layer includes both nitrogen and oxygen from a combination of $N_2O$ and $NH_3$ sources.

9. A method for manufacturing semiconductors comprising the steps of:
   a) providing a substrate;
   b) providing a first layer of polysilicon over the substrate, wherein the first layer of polysilicon has a thickness of approximately 20 to 500 angstroms;
   c) providing an interface layer over the first layer of polysilicon by exposing the first layer of polysilicon to an oxidation ambient; and
   d) providing a second layer of polysilicon over the interface layer, wherein the second layer of polysilicon is deposited separately in time from the first layer of polysilicon.

10. The method of claim 9, wherein step (c) includes substep of exposing the first layer of polysilicon to an oxidation ambient, the exposure providing an oxide layer over the first layer of polysilicon.

11. The method of claim 9, wherein the first layer of polysilicon has a thickness approximately within the range of 50 to 500 angstroms.

12. The method of claim 9, wherein the first layer of polysilicon has a thickness which is not greater than 300 angstroms.

13. The method of claim 9, wherein the first layer of polysilicon has a thickness of approximately 20 angstroms.

14. The method of claim 13, wherein the second layer of polysilicon has a thickness of approximately 2,000 angstroms.

15. The method of claim 9, wherein the interface layer includes nitrogen and oxygen.

16. The method of claim 9, wherein the interface layer includes nitrogen.

17. The method of claim 9, wherein the interface layer includes both nitrogen and oxygen from a combination of $N_2O$ and $NH_3$ sources.

18. The method of claim 9, further comprising step (e) of implanting a doping substance onto the second layer of polysilicon, wherein the interface layer impedes diffusion of the doping substance.

19. A method of manufacturing semiconductors comprising:
   a) providing a substrate;
   b) depositing a first layer of polysilicon through a deposition stream over the substrate, wherein the first layer polysilicon has a thickness of approximately 20 to 500 angstroms;
   c) forming an interface material by introducing an oxidation ambient into the deposition stream over the first layer of polysilicon; and
   d) providing a second layer of polysilicon over the first layer of polysilicon and interface material, wherein the second layer of polysilicon is deposited separately in time from the first layer of polysilicon.

20. The method of claim 19, wherein the interface reactant gas includes $N_2O$.

21. The method of claim 19, wherein the interface reactant gas includes $NH_3$.

22. The method of claim 19, further comprising step (e) of implanting a doping substance onto the second layer of polysilicon, wherein the interface layer impedes diffusion of the doping substance.

23. The method of claim 19, wherein the interface material includes oxygen and nitrogen.

* * * * *